United States Patent
Ejury

(10) Patent No.: US 7,721,232 B2
(45) Date of Patent: May 18, 2010

(54) DESIGNATED MOSFET AND DRIVER DESIGN TO ACHIEVE LOWEST PARASITICS IN DISCRETE CIRCUITS

(75) Inventor: Jens Ejury, San Jose, CA (US)

(73) Assignee: Infineon Technologies AG, Munich (DE)

( * ) Notice: Subject to any disclaimer, the term of this patent is extended or adjusted under 35 U.S.C. 154(b) by 1529 days.

(21) Appl. No.: 10/998,471

(22) Filed: Nov. 29, 2004

(65) Prior Publication Data
US 2006/0113657 A1 Jun. 1, 2006

(51) Int. Cl.
*H03F 3/38* (2006.01)
(52) U.S. Cl. .................. 716/2; 716/9; 330/10
(58) Field of Classification Search .............. 715/2, 715/9, 11; 330/10
See application file for complete search history.

(56) References Cited

U.S. PATENT DOCUMENTS

| | | | |
|---|---|---|---|
| 4,758,941 A | 7/1988 | Felton et al. | |
| 5,438,294 A | 8/1995 | Smith | |
| 5,665,996 A | 9/1997 | Williams et al. | |
| 5,973,368 A * | 10/1999 | Pearce et al. | 257/368 |
| 6,130,563 A | 10/2000 | Pilling et al. | |
| 2003/0023938 A1 * | 1/2003 | Nagasaka et al. | 716/2 |

* cited by examiner

*Primary Examiner*—Michael B Shingleton
(74) *Attorney, Agent, or Firm*—Eschweiler & Associates, LLC

(57) ABSTRACT

Apparatus are described for a pair of MOSFET power transistors, a MOSFET driver, and an idealized circuit layout utilized in a power stage such as that of a power conversion system. The power stage comprises a pair of MOSFET transistors having substantially identical electrical characteristics and complementary package configurations for simplifying and optimizing the layout of the power stage on a single side or layer of a printed circuit board. The ideal layout effectively avoids parasitic circuit components, minimizes layout area and costs, and permits operation at higher switching frequencies. A new MOSFET transistor pin configuration is also described that is essentially a functional mirror or functional complement of an existing MOSFET transistor pin configuration to provide the complementary package configurations and the optimized PCB layout. A customized MOSFET driver pin configuration further optimizes the power stage layout by arranging the pins of the driver to coordinate with those of the MOSFET transistor pair.

20 Claims, 8 Drawing Sheets

DESIGNATED MOSFET AND DRIVER DESIGN TO ACHIEVE LOWEST PARASITICS IN DISCRETE CIRCUITS

FIELD OF INVENTION

The present invention relates generally to integrated circuit devices and more particularly to systems and methods for minimizing circuit parasitics in the power stage of a DC to DC converter and other such devices by designating the design of a MOSFET transistor and driver.

BACKGROUND OF THE INVENTION

MOSFETs and other types of transistors are found in many modern semiconductor products where switching and/or amplification functions are needed. Speed requirements of MOS transistors continue to increase in order to facilitate higher speed switching frequencies, more phases, and faster transient response for improved product performance. In recent years, the size of MOSFET transistors and other related MOSFET components have only slightly decreased, while available printed circuit board (PCB) space has decreased at a faster pace to facilitate smaller and more portable electronic products. At the same time, many new applications of such devices have created a need to operate high current high speed MOSFET transistors and other such MOSFET devices at increased operating efficiency and reduced circuit losses. Accordingly, efforts continue to be made to design MOSFET products, which occupy less physical space, consume less power, and operate at higher switching speeds with a fast transient response.

Power MOSFETs are useful for these high current high speed switching applications such as power conversion products including DC to DC converters, DC to AC inverters, AC to DC switching power supplies, and switching power regulators. For example, power MOSFETs may be designed into high performance DC/DC converter applications such as notebook, server and VRM modules. Although several quasi-standard device footprints have been established for MOSFET transistors, the pool of standardized parts and such alternate or second-sources is limited, particularly in regard to package layouts that are available for higher current devices. Further, the design of such power MOSFET products has traditionally been done from the schematic for the desired end product. This approach, however, commonly yields an inadequate appreciation of the PCB layout and the circuit parasitics that result from the length/width dimensions of the traces, the capacitance between various circuit elements and traces, or the inductance of circuit vias, for example.

As the trend continues to make MOSFET products smaller and more portable, PCB space becomes scarce and relatively more expensive. In addition, system data busses and interface components are typically able to demand a higher priority than power supply space. The power supply and other such power conversion sections are relegated into spare sections of the board.

Accordingly, there is a need for an improved power conversion circuit layout and power MOSFET design that minimizes circuit parasitics in the layout thereby consuming less power, occupying less board space, and operating at high switching frequencies with a fast transient response.

SUMMARY OF THE INVENTION

The following presents a simplified summary in order to provide a basic understanding of one or more aspects of the invention. This summary is not an extensive overview of the invention. It is intended neither to identify key or critical elements of the invention nor to delineate the scope thereof. Rather, the primary purpose of the summary is to present some concepts of the invention in a simplified form as a prelude to the more detailed description that is presented later.

The invention relates to an improved MOSFET power stage design for minimizing circuit parasitics, for example, in a DC to DC converter or another such power conversion product, by designating the pin configuration in the package layout of a power MOSFET transistor and MOSFET driver. The present invention makes use of a custom pin configuration for one of the two power MOSFET transistors typically used in the power stage of a power conversion circuit. In one aspect of the invention, the custom pin configuration of the power MOSFET transistor is assigned or designated a complementary package configuration, which is essentially a functional mirror image or a functional complement of an existing pin configuration used in the industry. The complementary package configuration permits a greatly simplified PCB layout design that also minimizes circuit vias, multiple trace segments, and other unnecessary junctions or interconnections to avoid a large portion of the typical circuit parasitic elements.

Another aspect of the invention relates to a pair of the MOSFET transistors having substantially identical electrical characteristics with complementary package configurations comprising a first and second package and a first and second pin configuration to minimize power stage circuit interconnections and related circuit losses.

In yet another aspect of the present invention, a MOSFET driver for the transistor pair is also designated a pin configuration associated with a pin configuration of the transistor pair to further minimize the PCB layout and circuit parasitics.

In still another aspect of the present invention, the package configuration of one or more of the MOSFET transistors is an SO-8, a super SO-8, a DPAK, a D2PAK, or another surface mount device package.

In one aspect of the present invention, an integral heat sink plate is incorporated into the mounting surface of the MOSFET transistors for thermal conduction to a trace of the PCB. In one implementation, for example, the source of one transistor of the MOSFET transistor pair is electrically connected to the heat sink plate, while the other transistor of the pair connects the drain to the heat sink plate. In this way, the package is able to optimize the circuit layout while minimizing thermal losses.

In another aspect of the invention, specific pins of the power stage transistors are connected via a single trace of a single layer or side of a PCB.

In yet another aspect of the invention, specific pins of the power stage transistors and the MOSFET driver are connected via a single trace of a single layer or side of a PCB.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
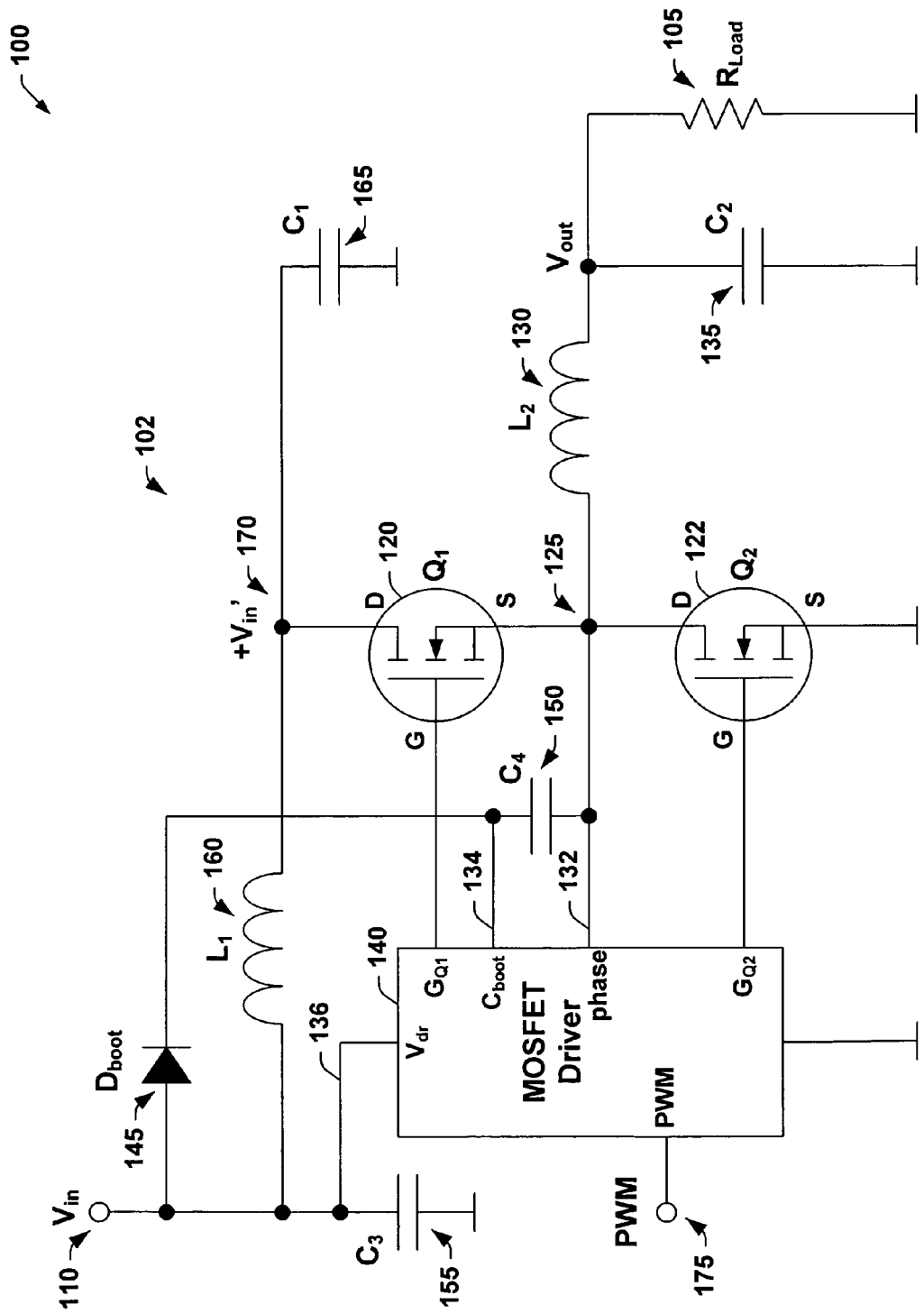
FIG. 1 is a schematic diagram illustrating an exemplary power converter circuit utilizing MOSFET transistors in a power stage and a MOSFET driver in accordance with the present invention.

The present invention will now be described with reference to the attached drawings, wherein like reference numerals are used to refer to like elements throughout. The invention relates to an improved power stage of a MOSFET power conversion product in which the package and/or pin configuration of a MOSFET power transistor and/or a MOSFET driver is designated to facilitate optimization of a PCB layout in order to avoid or mitigate circuit parasitic elements and their harmful effects.

Two MOSFET power transistors are often used in the power stage of the MOSFET power conversion device in a push-pull or upper/lower arrangement to provide a symmetrical voltage swing across a load connected to a common circuit node. It has been appreciated by the inventor of the present invention, that because of limited component and second source availability of such transistors particularly in surface mount devices, identical MOSFET transistors are often utilized in a layout requiring less than ideal trace layouts. Accordingly, in the present invention, a first transistor of the pair of MOSFET power transistors may have an existing pin configuration that is used typically in the industry, while the second of the pair is assigned or designated a complementary package/pin configuration that is essentially a functional mirror image of the first. The complementary pin configuration arrangement of the power transistor pair provides an opportunity to optimize the PCB layout of the power stage in a single trace layer, with minimal interconnection junctions, trace segments, through hole pads, and vias, without the added cost of multilayer designs.

For example, the high current pins of the transistors, which ordinarily connect to each other, may be ideally located directly opposite each other to minimize the circuit trace lengths and associated circuit parasitics in accordance with the present invention. In addition, the gate leads of the power transistors which go to the MOSFET driver, may also be located nearest a direction that is closest to the driver. Further, the driver pin configuration may also be designated to minimize the PCB trace lengths to provide an easy and clean layout. While illustrated and described hereinafter in the context of high current or high-frequency switching power stages of power conversion products, the invention finds utility in association with other circuits and types of semiconductor devices, and such other applications are contemplated as falling within the scope of the appended claims.

FIG. 1, for example, illustrates an exemplary MOSFET DC to DC step-down power converter 100, having a single phase power stage 102, such as may be used in accordance with the present invention. Converter 100 is a form of switchmode power supply that provides a lower voltage DC output $V_{out}$ to a load resistance $R_{Load}$ 105. The DC output $V_{out}$ is essentially "converted" from a higher input DC voltage $V_{in}$ 110 (e.g., provided by an unregulated power supply). High current, high speed MOSFET switching transistors $Q_1$ 120 and $Q_2$ 122 operate alternately. Transistor Q1 120 switches power supply current at a high frequency thru a common phase node 125 and a smoothing output inductor $L_2$ 130 to the load $R_{Load}$ 105, which is filtered by an output capacitor $C_2$ 135. Regulation, phase, and frequency control of the output voltage $V_{out}$ are provided by a MOSFET driver circuit 140 via gate control (e.g., $G_{Q1}$, and $G_{Q2}$) of MOSFET power transistors $Q_1$ 120 and $Q_2$ 122 in response to the PWM input signal at the driver. The phase input 132 to the driver comes from the common phase node 125, which is also the junction of, for example, the source of $Q_1$ 120 and the drain of $Q_2$ 122.

For providing the sufficiently high gate voltage at the high side MOSFET $Q_1$ 120, converter 100 of FIG. 1 further includes a so called bootstrap circuit, comprising a bootstrap diode $D_{boot}$ 145 and a capacitor $C_4$ 150. During the turn-on of the low side MOSFET $Q_2$ 122 the capacitor $C_4$ 150 will be charged via the diode $D_{boot}$ 145 to nearly $V_{in}$ 110. When the low side MOSFET $Q_2$ 122 turns off and the high side MOSFET $Q_1$ 120 turns on, the common node (134) between capacitor $C_4$ 150 and diode $D_{boot}$ 145 will shift from a zero level to $V_{in}$ 110. The capacitor $C_4$ 150 is now referenced to $V_{in}$ 110. Thus the capacitor $C_4$ 150 provides a sufficiently high voltage to drive the high side MOSFET $Q_1$ 120. The common node 134 between capacitor $C_4$ 150 and diode $D_{boot}$ 145 has a potential of nearly 2×Vin and is fed back to the driver IC 140 at $C_{boot}$ 134.

Power for the MOSFET driver 140 is filtered by a capacitor $C_3$ 155 and made available to the driver 140 at a $V_{dr}$ input 136, for example. An inductor $L_1$ 160 and a capacitor $C_1$ 165 filter the DC supply $V_{in}$ 110 to a +$V_{in}$' node 170 for a high current power circuit path of the power stage 102. A voltage applied to a PWM input 175 to the MOSFET driver 140 provides external pulse width modulation control of the converter 100.

Figure 2:
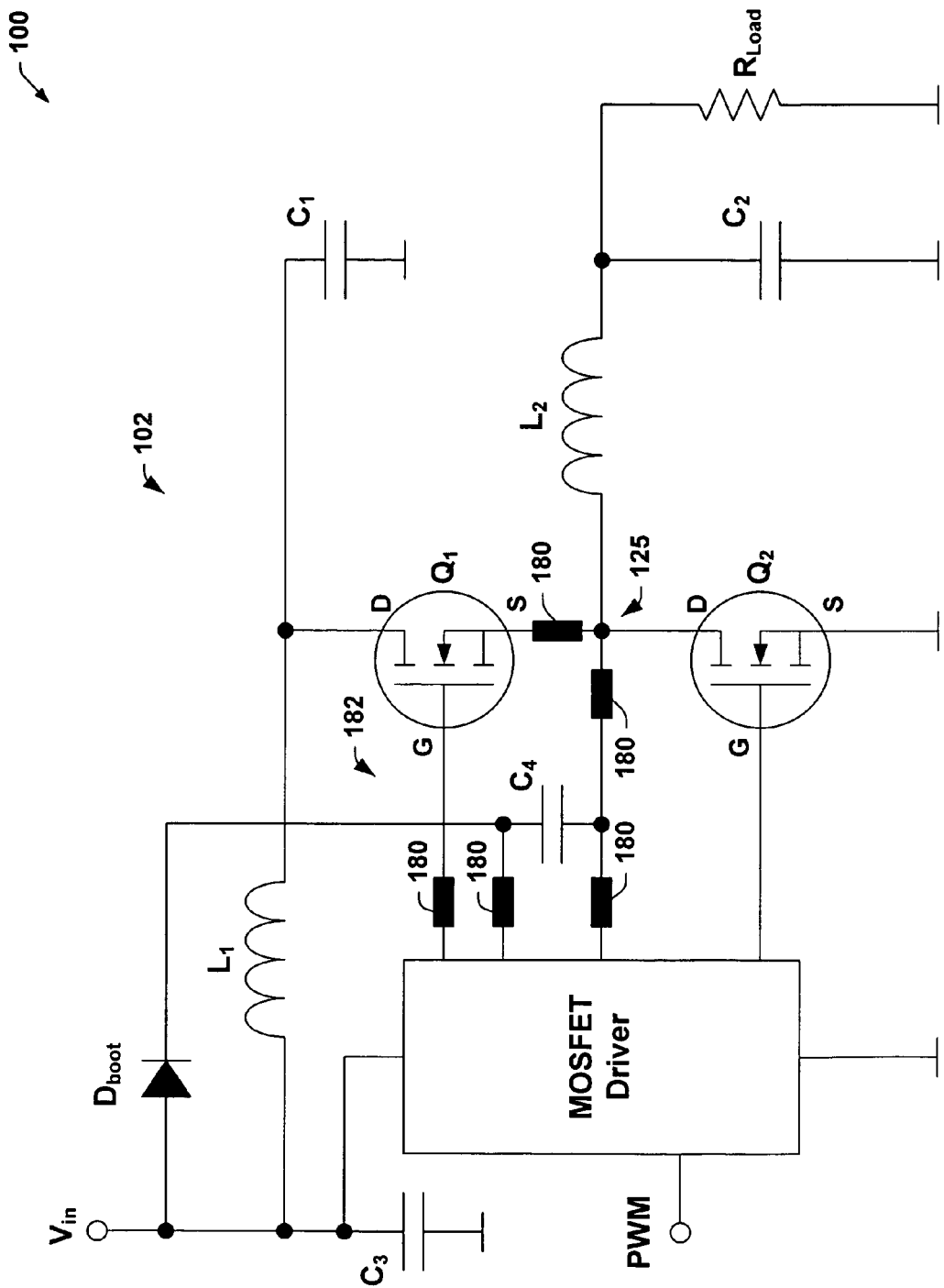
FIGS. 2-5 are schematic diagrams illustrating various circuit parasitic elements that may be present in a variety of circuit areas of the exemplary power converter of FIG. 1.

FIGS. 2-5 illustrate schematic diagrams of various circuit parasitic elements 180 (represented herein by black boxes 180) are appreciated by the inventor of the present invention that may be present in a variety of circuit areas of the exemplary power converter 100 of FIG. 1. As indicated previously, circuit parasitics are often produced, for example, by the resistance and inductance in lengths of PCB traces, vias, and plate thru holes and other such interconnection means. For example, FIG. 2 illustrates parasitic circuit elements 180 in the power stage 102 associated with a gate drive circuit 182 for the control FET (e.g., $Q_1$ 120) that were appreciated by the inventor as having a degrading effect on circuit performance. The gate driving capability of the control FET determines a large part of the switching losses of the power stage 102, thus there is a need to minimize such parasitic elements 180.

Figure 3:
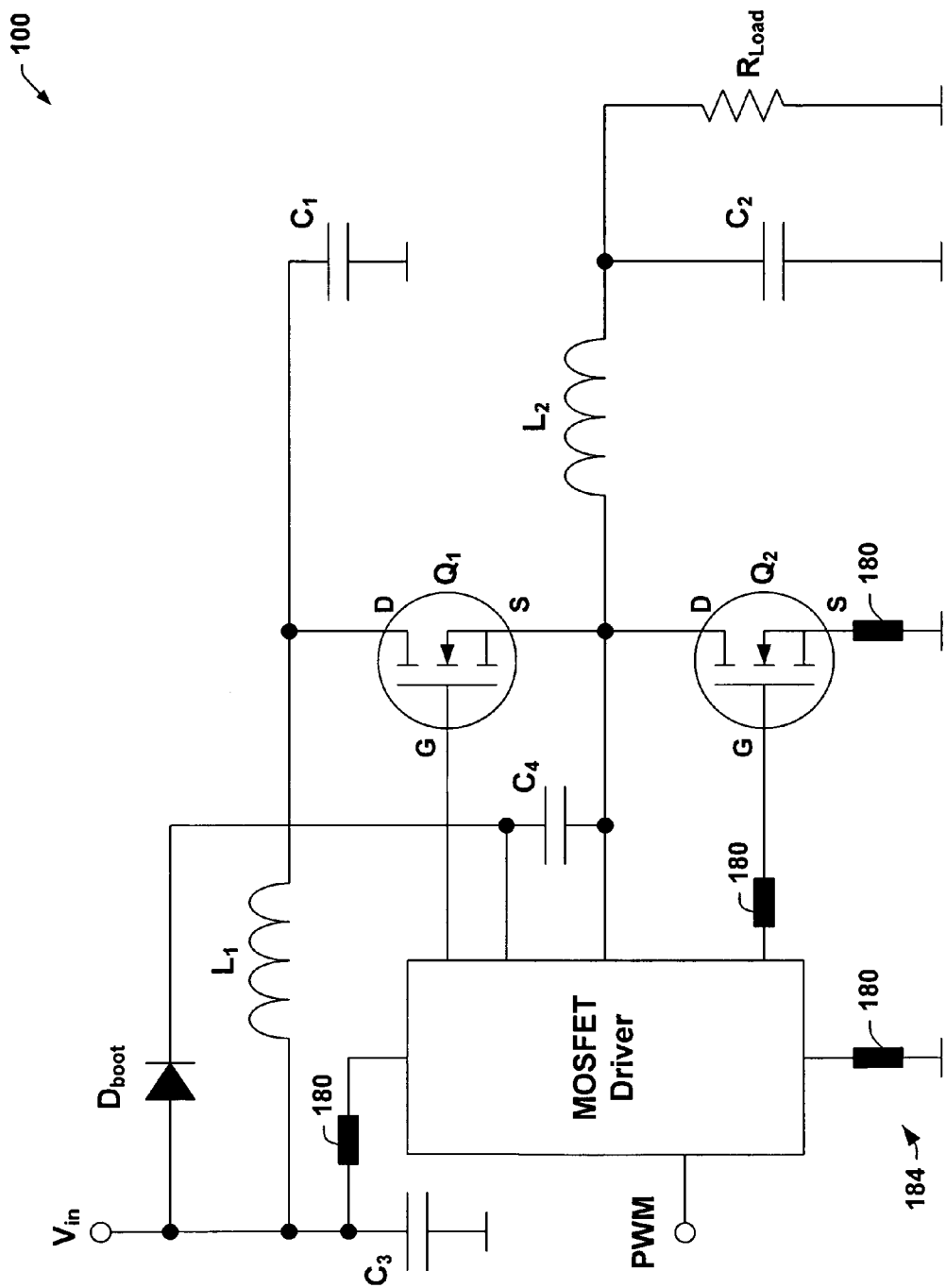

FIG. 3 illustrates additional parasitic circuit elements 180 in the power stage 102 associated with a gate drive circuit 184 for the synchronous FET (e.g., $Q_2$ 122). The gate driving capability of the synchronous FET determines the loss in the reverse diode of the FET, thus there is a need to minimize such parasitic elements 180.

Figure 4:
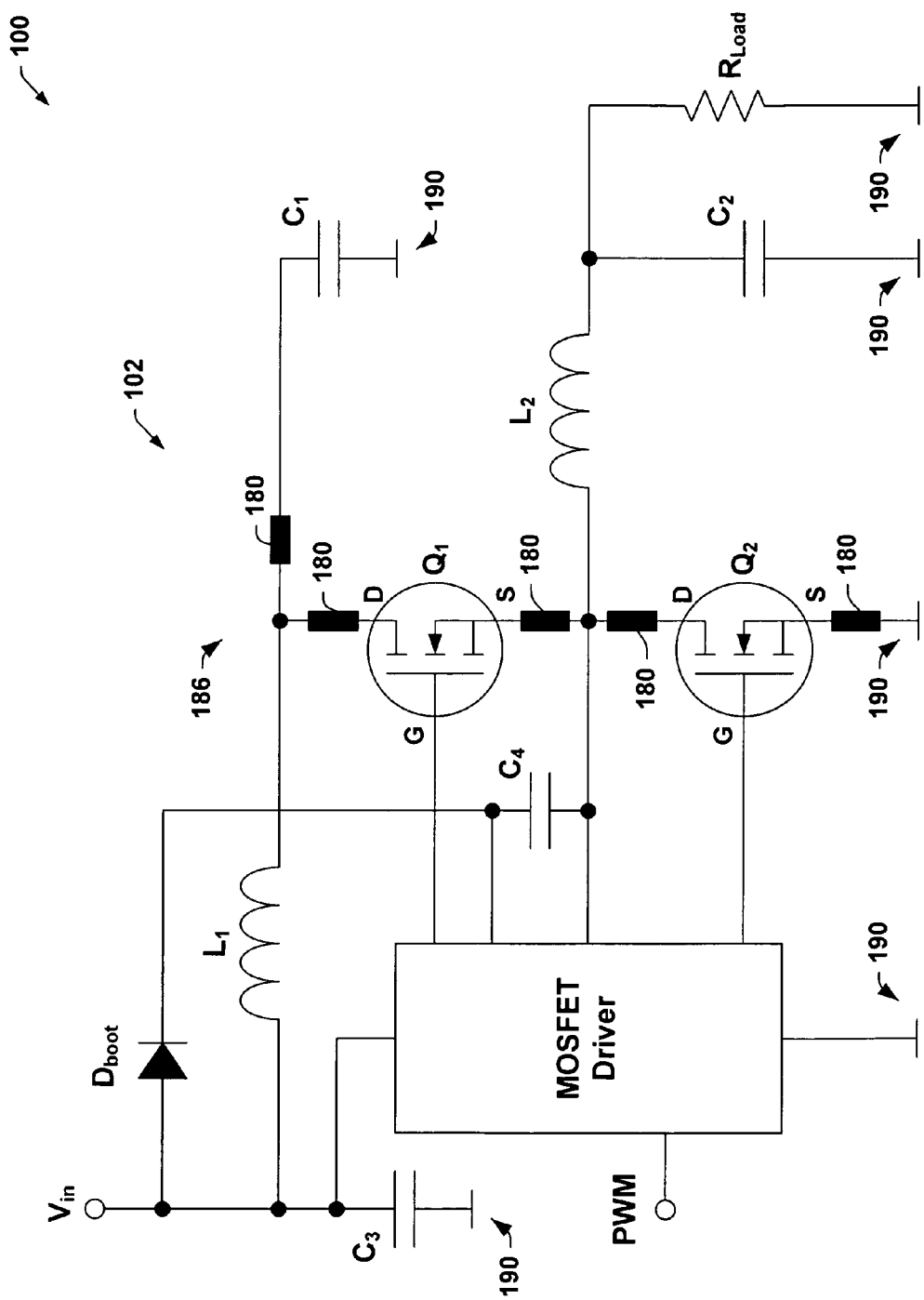

FIG. 4 illustrates further parasitic circuit elements 180 in the power stage 102 associated with a high current power circuit path 186, for example, from capacitor $C_1$ 165 through $Q_1$ 120 and through $Q_2$ 122 to ground 190. The high current power circuit path 186 directly influences the resistive power losses of the converter 100, and indirectly influences the inductive power losses, thus there is a need to minimize such parasitic elements 180.

Figure 5:
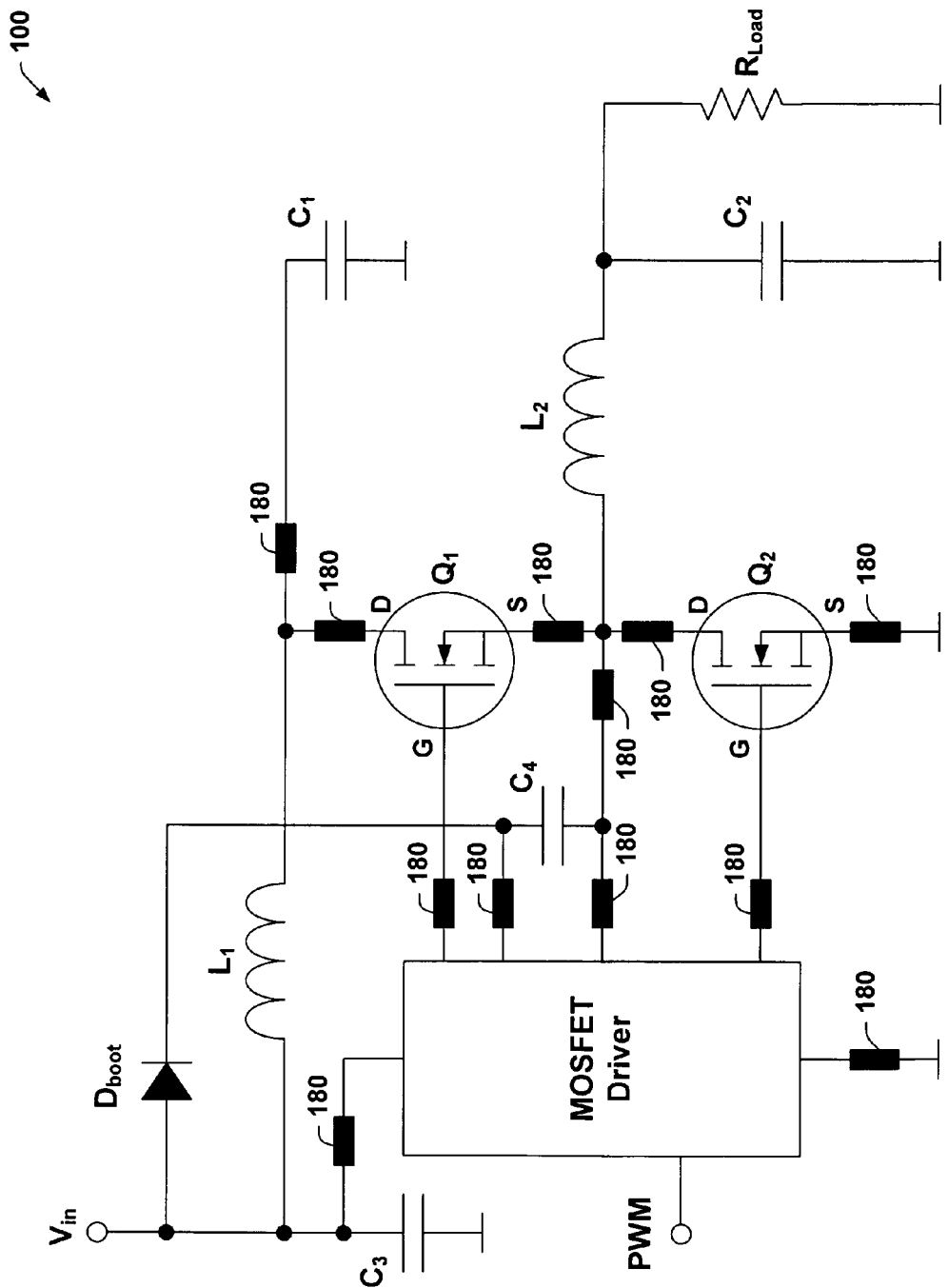

FIG. 5 illustrates a collection of the parasitic circuit elements 180 described above in the various areas of the power stage 102 of converter 100. The presence of such parasitic circuit elements 180 indicates that there are many critical interconnections in the PCB layout that may directly or indirectly influence power losses in the converter 100 and place major restrictions on the PCB layout, as appreciated by the inventor of the present invention.

Accordingly, a goal of the present invention is to provide a clean optimized layout that mitigates circuit parasitics by minimizing interconnection resistance and inductance. As previously indicated, a clean PCB layout is often difficult to realize with existing MOSFET surface mount devices. Thus, the inventor of the present invention has realized that a new MOSFET power transistor and new MOSFET driver is needed with package pinning that supports the optimized part placement and a low parasitic connection between each device. The inventor has further realized that the part placement within each phase of a multi-phase system may take advantage of the same optimized layout design. For example, in a four phase design, each phase may utilize the same optimized layout as will be illustrated and described in the context of a single phase power converter (e.g., power stage 102 of converter 100 of FIG. 1). By contrast, the use of conventional "dual drivers" may force the design to be asymmetrical and thus non-optimized due to resultant parasitics.

Further, the inventor has appreciated that relative to the optimized layout illustrated and described herein, a mirrored or otherwise reversed/inverted PCB and device pin layout is also provided. In addition, the inventor of the present invention has appreciated that there is a need to keep the phase node in the power stage (e.g., phase node 125 in the power stage 102 of FIG. 1) as small as possible to minimize, for example, EMI problems and charge loss. It is another goal of the present invention to achieve these performance and design objectives with the additional benefits of a discrete device solution. For example, discrete devices (individual part packages) offer the advantage of design flexibility for multiple applications, distributed thermal loading among the various discrete devices, and low cost. Further, in the case of the power transistors of the present invention, the use of an existing discrete MOSFET, which exists in many varieties, means that only one other discrete MOSFET power transistor need be developed to provide a complementary package/pin configuration pair.

The realization of these goals and design advantages will now be illustrated and described in the context of FIGS. 6A, 6B, 7A, 7B, 8, and 9.

Figures 6A, 6B:
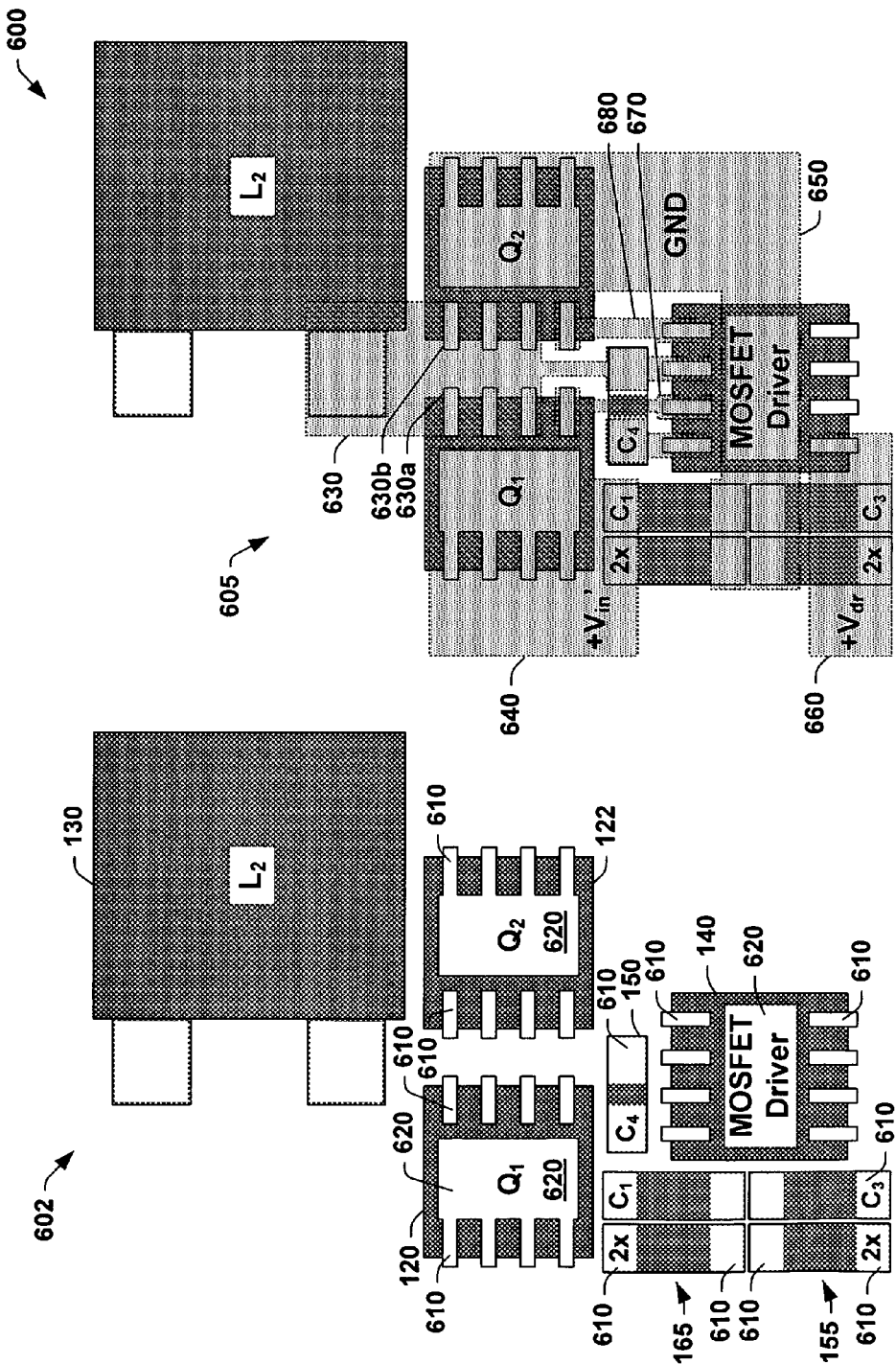
FIGS. 6A and 6B are bottom views of partial circuit layouts of the components and circuit traces in the power stage area of the exemplary power converter of FIG. 1.

FIGS. 6A and 6B, for example, illustrate bottom views (through the PCB) of a partial circuit layout 600, comprising the components 602 and circuit traces 605 (FIG. 6B), respectively, of the power stage 102 of the exemplary power converter 100 of FIG. 1. FIG. 6A, illustrates a bottom view of the components 602 at the lead and pin contact surfaces 610. The exemplary layout of the present invention, illustrates surface mount devices (SMDs) having contact surfaces 610 (lighter areas) of components 602 soldered to traces 605 of the PCB. In addition to providing electrical connection, the solder joints in close proximity to the semiconductor device, provide a low level thermal transfer path from the heat source (e.g., the MOSFET chip) to the surrounding PCB traces 605. By contrast, a heat sink plate 620 that has a low thermal resistance (path) to the interior semiconductor die may be employed to provide greatly enhanced heat distribution to the surrounding copper trace layer 605, for example, in MOSFET transistors $Q_1$ 120 and $Q_2$ 122, and MOSFET driver 140.

FIG. 6B further illustrates that the traces 605 have general and specific layout goals. Accordingly traces 605 may be assigned specific functions and purposes. For example, some general layout goals for traces 605 are to electrically interconnect the components 602 of power stage 102, for example, in the shortest possible length (least resistance), and in a single trace layer (less overall length, complexity, and cost). For example, a trace 630 is associated with the phase node 125 of FIG. 1. A particular goal for trace 630 is that the phase node 125 should be as small and short as possible to avoid the EMI effects discussed above.

In the high current path, trace 630 of phase node 125 interconnects, for example, a plurality of drain pins 630a of $Q_1$ 120 and a plurality of source pins 630b of $Q_2$ 122. The pins of $Q_1$ 120 and $Q_2$ 122 are strategically placed opposite each other (e.g., facing each other) to provide a very short high current path to the inductor $L_2$. Trace 630 of phase node 125 is also shown interconnecting with boot capacitor $C_4$ 150 on a short route to the "phase input" of MOSFET driver 140 to minimize the phase node 125. The idealized layout of trace 630 illustrates the value of the specific pin assignment of $Q_1$ 120, $Q_2$ 122, and driver 140 used in accordance with the present invention.

Another general layout goal is to provide thermal cooling of the components on the traces 605. Such cooling trace areas may be silent nodes, for example, $+V_{in}$' trace 640 for the $+V_{in}$' node 170, and ground trace 650 for the circuit ground 190, respectively. For example, the heat sink plate 620 on the surface mount side (PCB side) of transistor $Q_1$ 120 is electrically common with its drain pins and the $+V_{in}$' node 170 for the high current path. Similarly, the heat sink plate 620 on the surface mount side of transistor $Q_2$ 122 is electrically common with its source pins and the ground 190. Likewise, the heat sink plate 620 on the surface mount side of driver 140 is electrically common with its ground pins and the ground 190. Ground trace 650 further interconnects to the ground side of capacitor $C_1$ 165 and capacitor $C_3$ 155 (FIG. 6B), wherein either capacitor may comprise, for example, a set of one or more capacitors connected together in parallel.

A trace 660 of $+V_{dr}$ driver node 110 is also shown interconnecting capacitor $C_3$ 155 (e.g., a double set of capacitors) and the "ground input" pin of MOSFET driver 140 ideally located by assignment nearby. A trace 670 interconnects a gate drive pin $G_{Q1}$ of driver 140 to the gate of transistor $Q_1$ 120, while a trace 680 interconnects another gate drive pin $G_{Q2}$ of driver 140 to the gate of transistor $Q_2$ 122. As shown, the gate drive pins of driver 140 are also strategically positioned (assigned) to coincide with the gate pin positions of transistors $Q_1$ 120 and $Q_2$ 122, thus providing ideally short gate drive traces 670 and 680, respectively.

Figure 7B:
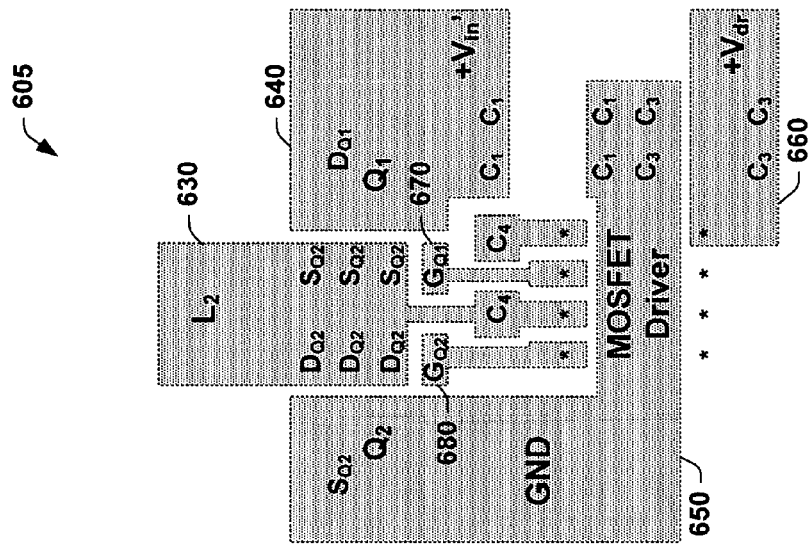
FIGS. 7A and 7B are top views of the circuit layouts of the components and traces in the power stage area of the exemplary power converter of FIGS. 1, 6A, and 6B.
Figure 7A:
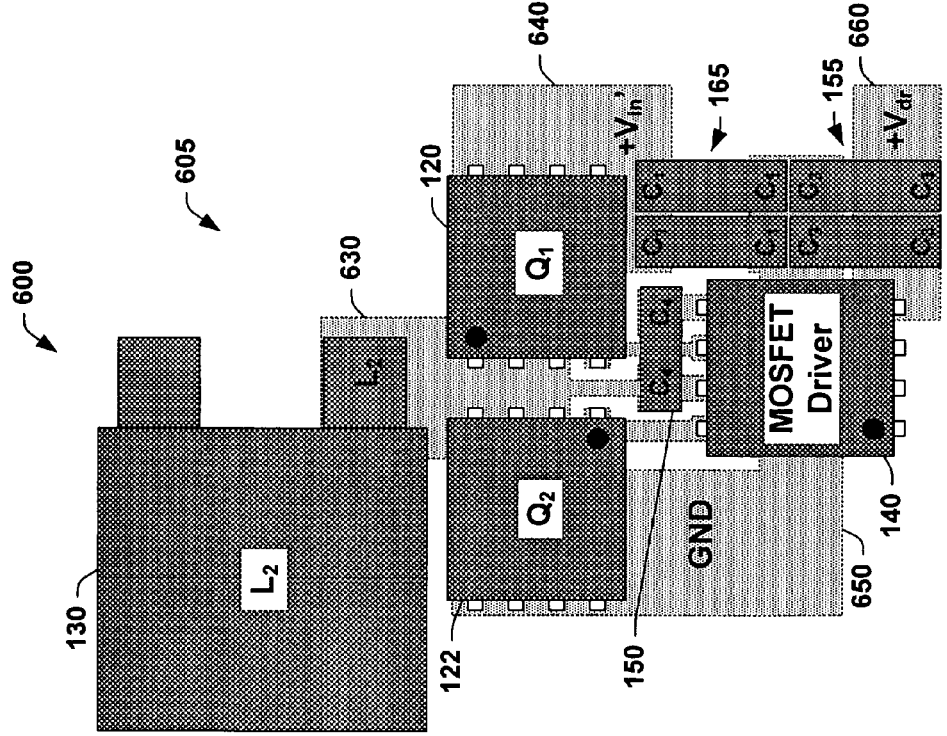

FIGS. 7A and 7B illustrate top views of the circuit layout 600 of the components and traces in the power stage area 102 of the exemplary power converter 100 of FIGS. 1, 6A, and 6B. The top views of FIGS. 7A and 7B are essentially reversed images of those of the bottom views of FIGS. 6A and 6B, but serve to further illustrate that such mirror image layouts including inverted layouts are also possible in the context of the present. FIG. 7A, for example, illustrates a top view of the circuit layout 600 of the components 602 overlying the circuit traces 605 of the power stage 102 of the exemplary power converter 100 of FIGS. 1, 6A, and 6B. FIG. 7B illustrates the PCB traces 605 of layout 600 without the components 602 to better reveal the layout. FIG. 7B also illustrates the general contact areas of the lead and pin contact surfaces 610 for the components 602.

Figures 8, 9:
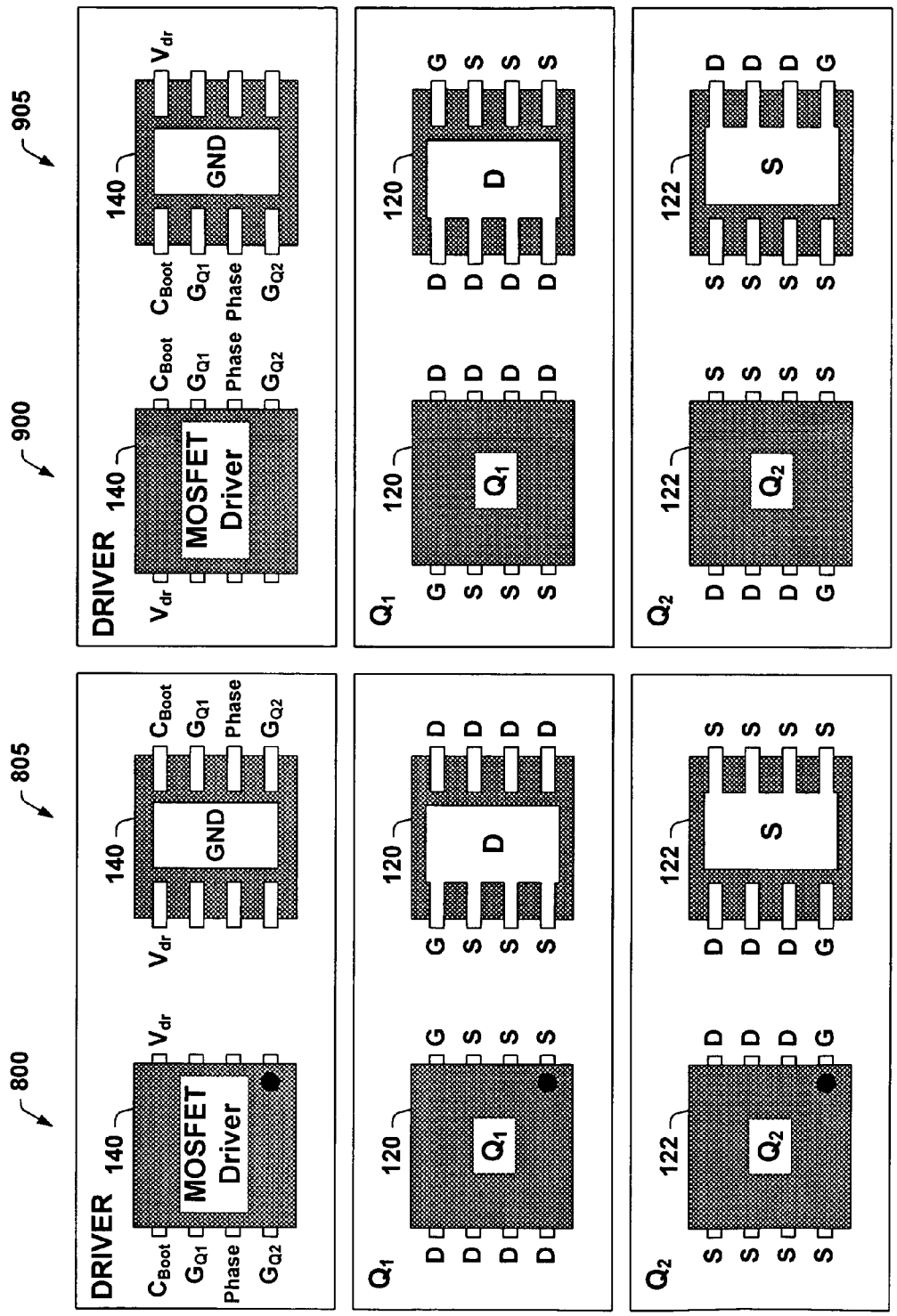
FIG. 8 illustrates top and bottom views, respectively, of an exemplary package and pin configuration of an exemplary MOSFET driver and MOSFET transistors such as may be used in the exemplary power converter of FIG. 1.
FIG. 9 illustrates top and bottom views, respectively, of another exemplary package and pin configuration of an exemplary MOSFET driver and MOSFET transistors such as may be used in the exemplary power converter of FIG. 1.

FIG. 8 illustrates top and bottom views, respectively, of an exemplary package and pin configuration of an exemplary MOSFET driver and a pair of MOSFET transistors such as may be used in the exemplary power converter 100 of FIG. 1 in accordance with the present invention.

In particular, the left column for each device represents the top views 800 of each device, while the right column represents bottom views (PCB side) 805 of the respective device. Transistor $Q_1$ 120 and transistor $Q_2$ 122 functionally complement or essentially functionally mirror the pin placements of each other. While the pin configuration of the MOSFET transistor $Q_1$ 120 currently exists, the pin configuration or pin assignments for MOSFET transistor $Q_2$ 122 and MOSFET driver 140 are new in accordance with the layout of the present invention. For example, the pin assignments of $Q_2$ 122 may be seen to functionally mirror the placement of the pin assignments of $Q_1$ 120, such that the corresponding interconnecting pins (drain and source) of both transistors are located directly opposite each other when the two devices are positioned on the PCB layout as illustrated in FIGS. 6A, 6B, 7A, and 7B. In this way, the packages have pin configurations that complement one another forming complementary pin configurations and corresponding complementary package configurations.

In one example, if the gate of $Q_1$ 120 were seen as pin 4, the source as pins 1-3, and the drain as pins 5-8, then in $Q_2$ 122 the gate would be pin 1, the drain as pins 2-4, and the source as pins 5-8. The pin configuration and package of existing $Q_1$ 120 in this example, has the gate pin on the same side of the package as the source pins and the drain pins on the opposite side. Conversely, the pin configuration and package of $Q_2$ 122 of this example, has the gate pin on the same side of the package as the drain pins and the source pins on the opposite side. Therefore, complementary pin configurations and corresponding complementary package configurations are formed. In this way, circuit trace lengths are minimized, without the use of more complex and expensive multi-layer designs to avoid the accompanying circuit parasitics discussed above.

Thus, the present invention permits easier parts layout by making it easier to combine, for example, the power components in the critical connections. This layout improvement leads to shorter traces, less vias, less used layers, less board space, and a symmetrical phase design. In this way, the parasitics can be diminished, efficiency increases, and interference collisions with other traces can be more easily avoided.

Although the present invention is described and illustrated in the context of an SO-8 or a Super SO-8 type SMD package configuration, the invention is also applicable to other package designs including DPAK and D2PAK type packages or SIP and DIP type packages.

FIG. 9 illustrates top and bottom views, respectively, of alternate exemplary package and pin configuration of an exemplary MOSFET driver and MOSFET transistors such as may be used in the exemplary power converter 100 of FIG. 1.

As in the previous figure, the left column for each alternate device pin configuration (pinnout) represents the top views 900 of each device, while the right column represents bottom views (PCB side) 905 of the respective device. Transistor $Q_1$ 120 and transistor $Q_2$ 122 functionally complement the pin placements of each other. While the pin configuration of the MOSFET transistor $Q_1$ 120 represents a possible pinnout variation of a MOSFET device, the pin configuration or pin assignments for MOSFET transistor $Q_2$ 122 and MOSFET driver 140 are new in accordance with the present invention. For example, the pin assignments of $Q_2$ 122 may be easily seen to functionally complement the placement of the pin assignments of $Q_1$ 120, such that the corresponding interconnecting pins of both transistors are located directly opposite each other when the two devices are positioned on the PCB layout as suggested in FIGS. 6A, 6B, 7A, and 7B. In this way, the packages have pin configurations that complement one another forming complementary pin configurations and corresponding complementary package configurations.

In one example, if the gate of $Q_1$ 120 were seen as pin 5, the source as pins 6-8, and the drain as pins 1-4, then in $Q_2$ 122 the gate would be pin 8, the drain as pins 5-8, and the source as pins 1-4. The pin configuration and package of the transistor variant $Q_1$ 120 in this alternate example, still has the gate pin on the same side of the package as the source pins and the drain pins on the opposite side of the package. Conversely, the pin configuration and package of $Q_2$ 122 of this example, still has the gate pin on the same side of the package as the drain pins and the source pins on the opposite side of the package.

Therefore, complementary pin configurations and corresponding complementary package configurations are formed. In this way, circuit trace lengths are minimized, without the use of more complex and expensive multi-layer designs to avoid the accompanying circuit parasitics discussed above.

Although a comparison of the pin configurations of FIGS. 8 and 9 illustrate horizontally mirrored images of each other, it will be further appreciated that vertically inverted complementary package configurations are also possible in the context of the present invention.

Moreover, it will be appreciated that the package pin configurations assigned according to an optimized layout of the present invention may be implemented in the fabrication of the semiconductor devices illustrated and described herein as well as in producing other devices not illustrated or described.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A power stage circuit, comprising:
a pair of MOSFET transistors having substantially identical electrical characteristics coupled together at a common phase node, the pair of transistors having complementary package configurations comprising first and second packages, the packages having first and second pin configurations, respectively,
wherein a source pin and a gate pin on a first side of the first package comprises the first pin configuration, and wherein a drain pin and a gate pin on a first side of the second package comprises the second pin configuration, and the first sides of the first and second packages face each other.

2. The power stage circuit of claim 1, further comprising a MOSFET driver having a driver pin configuration spatially associated with the pin configurations of the pair of MOSFET transistors and electrically coupled thereto.

3. The power stage circuit of claim 1, wherein the first and second pin configurations comprise a physical arrangement of the pins that functionally complement each other, wherein corresponding pins of the first sides of the first and second packages are electrically coupled, when the packages are bonded into position on a printed circuit board adjacent to each other and facing each other, the printed circuit board having a power stage circuit layout.

4. The power stage circuit of claim 3, wherein the package configuration of the transistors is one of an SO-8, a super SO-8, a DPAK, and a $D^2PAK$.

5. The power stage circuit of claim 1, wherein the first and second pin configurations comprise:
the pins of the first and second packages arranged in two parallel rows of pins comprising a first and second row on opposite sides of each package;
the first pin configuration of the first package comprises a source pin and a gate pin along the first row of pins, and a drain pin on the second row of pins;
the second pin configuration of the second package comprises a source pin along the first row of pins, and a drain pin and a gate pin on the second row of pins; and
wherein the gate pins of the first and second packages are located at opposite ends of the rows of pins and opposite sides of the packages;
wherein the physical pin arrangement of the first and second packages functionally complement each other.

6. The power stage circuit of claim 1, wherein the first and second packages further comprise an integral heat sink having a thermally conductive plate located on a printed circuit board mounting surface of the package for thermal conduction to a trace of the board, the heat sink plate electrically connected to one of a source pin and a drain pin.

7. The power stage circuit of claim 6, wherein the heat sink plate of the first MOSFET transistor package is electrically connected to the drain pin, and the heat sink plate of the second MOSFET transistor package is electrically connected to the source pin.

8. The power stage circuit of claim 2, wherein a phase pin of the MOSFET driver is electrically connected to the source pin of the first MOSFET transistor and the drain pin of the second MOSFET transistor.

9. The power stage circuit of claim 8, wherein the source pin of the first MOSFET transistor and the drain pin of the second MOSFET transistor are electrically connected by a single continuous trace on one of a single side or single layer of a printed circuit board.

10. The power stage circuit of claim 8, wherein a first gate pin of the MOSFET driver is electrically connected by a single continuous first trace on one of a single side or single layer of a printed circuit board to the gate of the first MOSFET transistor, and a second gate pin of the MOSFET driver is electrically connected by a single continuous second trace on one of a single side or single layer of the printed circuit board to the gate of the second MOSFET transistor, respectively.

11. The power stage circuit of claim 10, wherein the package of the MOSFET driver is one of an SO-8 and a super SO-8, and wherein the Vdr function is pin four of the driver, the Cboot function is pin five of the driver, the gate of the first MOSFET transistor is connected to pin six of the driver, the phase pin of the driver is pin seven, and the gate of the second MOSFET transistor is connected to pin eight of the driver.

12. The power stage circuit of claim 1, wherein a source pin of the first MOSFET transistor package and a drain pin of the second MOSFET transistor package are electrically connected by a single continuous trace on one of a single side or single layer of a printed circuit board.

13. The power stage circuit of claim 1, wherein corresponding interconnecting pins of the first sides of the first and second packages are located to face each other when the packages are bonded into position on a printed circuit board.

14. The power stage circuit of claim 1, wherein the second MOSFET transistor package comprises:
a MOSFET power transistor within a surface mount package having a source pin, a drain pin, and a gate pin, the package having a pin configuration comprising:
two parallel rows of pins arranged in a first and second row on opposite sides of the package;
the first row comprising the source pin; and
the second row comprising the drain pin and the gate pin.

15. The power stage circuit of claim 14, further comprising an integral heat sink having a thermally conductive plate located on a printed circuit board mounting surface of the package for thermal conduction to a trace of a printed circuit board, the heat sink plate electrically connected to the source pin of the MOSFET transistor.

16. The power stage circuit of claim 14, wherein the package of the transistor is one of an SO-8 and a super SO-8.

17. The power stage circuit of claim 16, wherein the source is electrically connected to pins one, two, three and four, the gate is connected to pin five, and the drain is connected to pins six, seven and eight.

18. The power stage circuit of claim 14, wherein the package of the transistor is one of a DPAK and a $D^2PAK$.

19. The power stage circuit of claim 18, wherein the drain is electrically connected to pin one, the source is connected to pin two, and the gate is connected to pin three.

20. The power stage circuit of claim 14, wherein the package of the transistor is a discrete device package.

* * * * *